US010583788B2

(12) United States Patent
Toda et al.

(10) Patent No.: US 10,583,788 B2
(45) Date of Patent: Mar. 10, 2020

(54) SOUND SYSTEM FOR VEHICLE

(71) Applicant: Mazda Motor Corporation, Aki-gun, Hiroshima (JP)

(72) Inventors: Isao Toda, Hatsukaichi (JP); Hironobu Hashiguchi, Hiroshima (JP); Koji Wakamatsu, Hiroshima (JP)

(73) Assignee: Mazda Motor Corporation, Aki-gun, Hiroshima (JP)

( * ) Notice: Subject to any disclaimer, the term of this patent is extended or adjusted under 35 U.S.C. 154(b) by 0 days.

(21) Appl. No.: 15/974,404

(22) Filed: May 8, 2018

(65) Prior Publication Data

US 2018/0326919 A1 Nov. 15, 2018

(30) Foreign Application Priority Data

May 11, 2017 (JP) ................................. 2017-094624

(51) Int. Cl.
*B60R 11/02* (2006.01)
*H04S 7/00* (2006.01)
*G06F 3/16* (2006.01)
*H04R 3/12* (2006.01)
*H04R 5/02* (2006.01)
(Continued)

(52) U.S. Cl.
CPC .......... *B60R 11/0217* (2013.01); *G06F 3/165* (2013.01); *H04S 7/30* (2013.01); *H04S 7/302* (2013.01); *H03G 3/3005* (2013.01); *H03G 3/32* (2013.01); *H04R 3/12* (2013.01); *H04R 5/02* (2013.01); *H04R 2420/01* (2013.01); *H04R 2499/13* (2013.01)

(58) Field of Classification Search
CPC ....... B60R 11/0217; G06F 3/165; H04R 3/12; H04R 5/03; H04R 2499/13; H03G 3/32; H03G 3/3005
USPC .......................................... 381/302, 86, 71.4
See application file for complete search history.

(56) References Cited

U.S. PATENT DOCUMENTS

| 5,034,984 A | * | 7/1991 | Bose ......................... H03G 3/32 381/107 |
| 5,677,960 A | * | 10/1997 | Unno ....................... H03G 3/32 381/71.1 |
| 2005/0190935 A1 | | 9/2005 | Sakamoto |

(Continued)

FOREIGN PATENT DOCUMENTS

| DE | 102009026589 A1 | 12/2009 |
| JP | H0585288 A | 4/1993 |

(Continued)

OTHER PUBLICATIONS

European Patent Office, Extended European Search Report Issued in Application No. 18000411.1, dated Oct. 10, 2018, Germany, 10 pages.

*Primary Examiner* — Jesse A Elbin
(74) *Attorney, Agent, or Firm* — Alleman Hall Creasman & Tuttle LLP

(57) ABSTRACT

A sound system for a vehicle driven by an engine is provide, which includes an audio device for an internal space of a cabin of the vehicle, and a traveling state determiner configured to determine a traveling state of the vehicle. The audio device is configured to change a quality of a sound reproduced by a sound source and, when the traveling state determined by the traveling state determiner is a given traveling state, degrade the quality of the reproduced sound.

18 Claims, 6 Drawing Sheets

(51) Int. Cl.
*H03G 3/30* (2006.01)
*H03G 3/32* (2006.01)

(56) References Cited

U.S. PATENT DOCUMENTS

| | | | |
|---|---|---|---|
| 2005/0213776 A1* | 9/2005 | Honji | H03G 3/32 381/86 |
| 2010/0014691 A1* | 1/2010 | Moseley | H03G 3/32 381/107 |
| 2012/0269358 A1 | 10/2012 | Gee et al. | |
| 2012/0308036 A1* | 12/2012 | Christoph | H03G 3/32 381/86 |

FOREIGN PATENT DOCUMENTS

| | | |
|---|---|---|
| JP | H07-066652 A | 3/1995 |
| JP | H07-131882 A | 5/1995 |
| JP | 2776092 B2 | 7/1998 |
| JP | H11-075284 A | 3/1999 |
| JP | 2002135900 A | 5/2002 |
| JP | 2008141524 A | 6/2008 |

* cited by examiner

SOUND SYSTEM FOR VEHICLE

TECHNICAL FIELD

The present disclosure relates to sound systems for vehicles.

BACKGROUND OF THE DISCLOSURE

Vehicles are generally equipped with audio devices that play an audio sound in a cabin. JP2776092B and JP1993-085288A disclose audio devices that perform localization of an audio sound so that a person(s) on board is able to hear the audio sound from a given position in a cabin.

Meanwhile, vehicles which are focused on that enjoyment of traveling, such as sports cars, are required to actively cause person(s) on board, especially a vehicle driver, to hear (listen to) an engine sound. That is, since the engine sound is a good indication of a vehicle state, it becomes an extremely important element in the enjoyment of traveling.

When the audio device is operated to play an audio sound in the cabin, the engine sound may be disturbed by the audio sound and becomes hard to hear from time to time. If the operation of the audio device is stopped to facilitate the hearing of the engine sound, the audio sound cannot be enjoyed at all and this is not suitable.

SUMMARY OF THE DISCLOSURE

The present disclosure is made in view of the above situations and aims to provide a sound system for a vehicle, with which, even in a state where an audio sound is played in a cabin, an engine sound is more clearly recognizable as needed.

In order to achieve the above aim, according to one aspect of the present disclosure, a sound system for a vehicle driven by an engine is provided, which includes an audio device for an internal space of a cabin of the vehicle, and a traveling state determiner configured to determine a traveling state of the vehicle. The audio device is configured to change a quality of a sound reproduced by a sound source and, when the traveling state determined by the traveling state determiner is a given traveling state, degrade the quality of the reproduced sound.

According to this structure, in the given traveling state, an engine sound is recognized more clearly. More specifically, since the recognizability of the audio sound improves as the sound quality is higher, the recognizability of the engine sound is raised by degrading the sound quality to lower the recognizability of the audio sound. Thus, the person(s) on board is able to clearly recognize a state of the vehicle based on (a change of) the engine sound recognized clearly while enjoying the audio sound, and this is preferable for enjoying driving and safe driving.

The vehicle may be configured to selectably perform an automatic operation. While the automatic operation is performed, the audio device may not degrade the quality of the reproduced sound regardless of the traveling state of the vehicle. This is because, during the automatic operation, the driver is relaxing and he/she is allowed to fully enjoy the audio sound.

The degradation of the quality of the reproduced sound may be performed without notification to a person in the vehicle. Thus, a situation in which the person(s) on board is irritated by the notification for the change in sound quality, is prevented.

The degradation of the quality of the reproduced sound may be performed gradually. Thus, a sharp change in sound quality is avoided and this is preferable for preventing the person(s) on board from feeling a sense of discomfort, etc. due to the change in sound quality, and also preventing the person(s) on board from noticing the sound quality change.

Speakers configured to play the reproduced sound inside the cabin may be individually provided for a vehicle driver and for a front passenger. The degradation of the quality of the reproduced sound may only be performed for the speaker for the driver, between the speaker for the driver and the speaker for the front passenger. It is preferable for allowing the front passenger to enjoy high quality audio sound normally.

The given traveling state may be a state where an operation load is high. Thus, the driver is able to recognize the engine sound more clearly when the operation load is high and focus on the vehicle state based on the engine sound, and it is preferable for enhancing safety.

DETAILED DESCRIPTION OF THE DISCLOSURE

Figure 1:
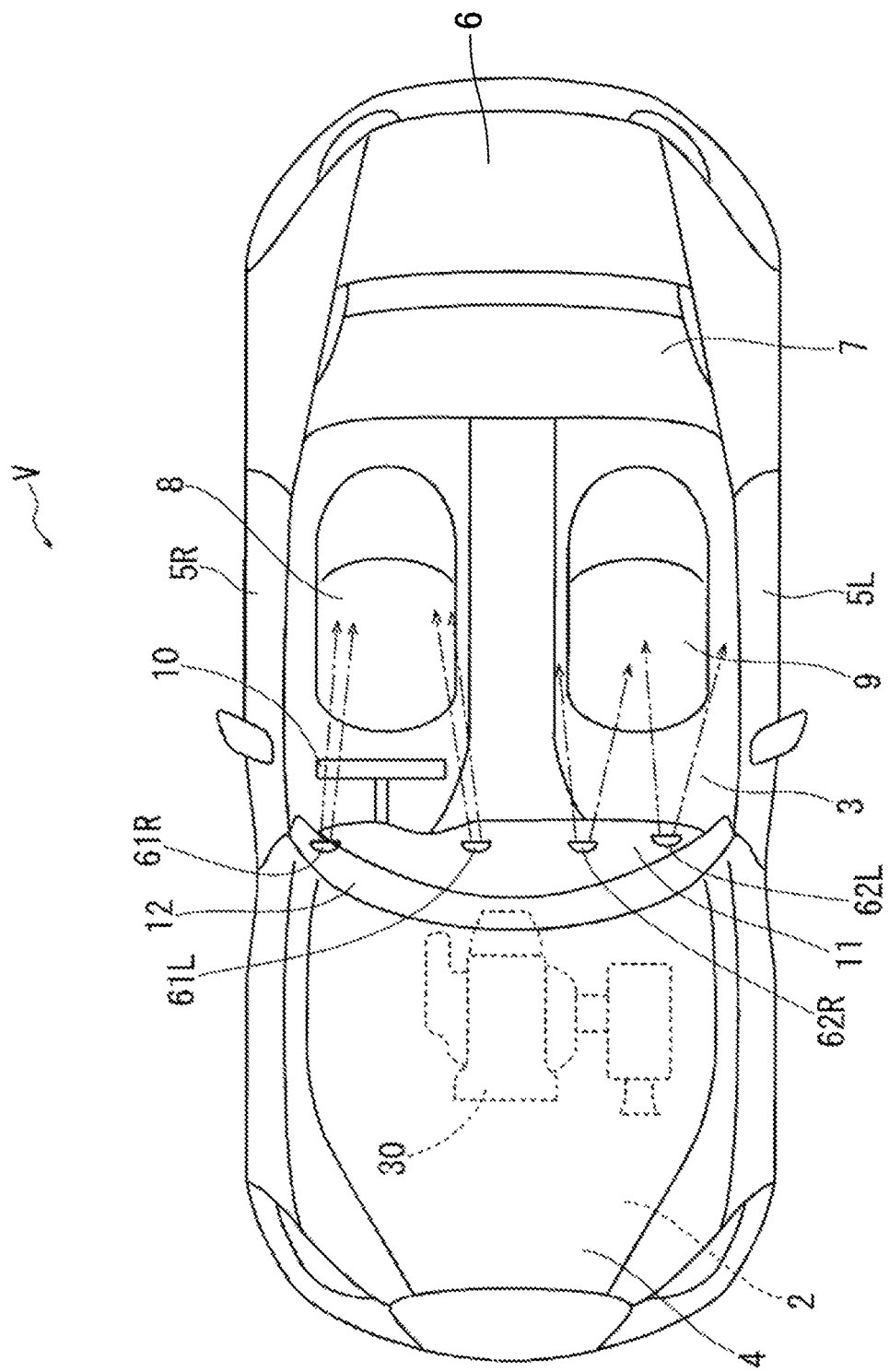
FIG. 1 is a plan view illustrating one example of a vehicle to which the present disclosure is applied.
Figure 2:
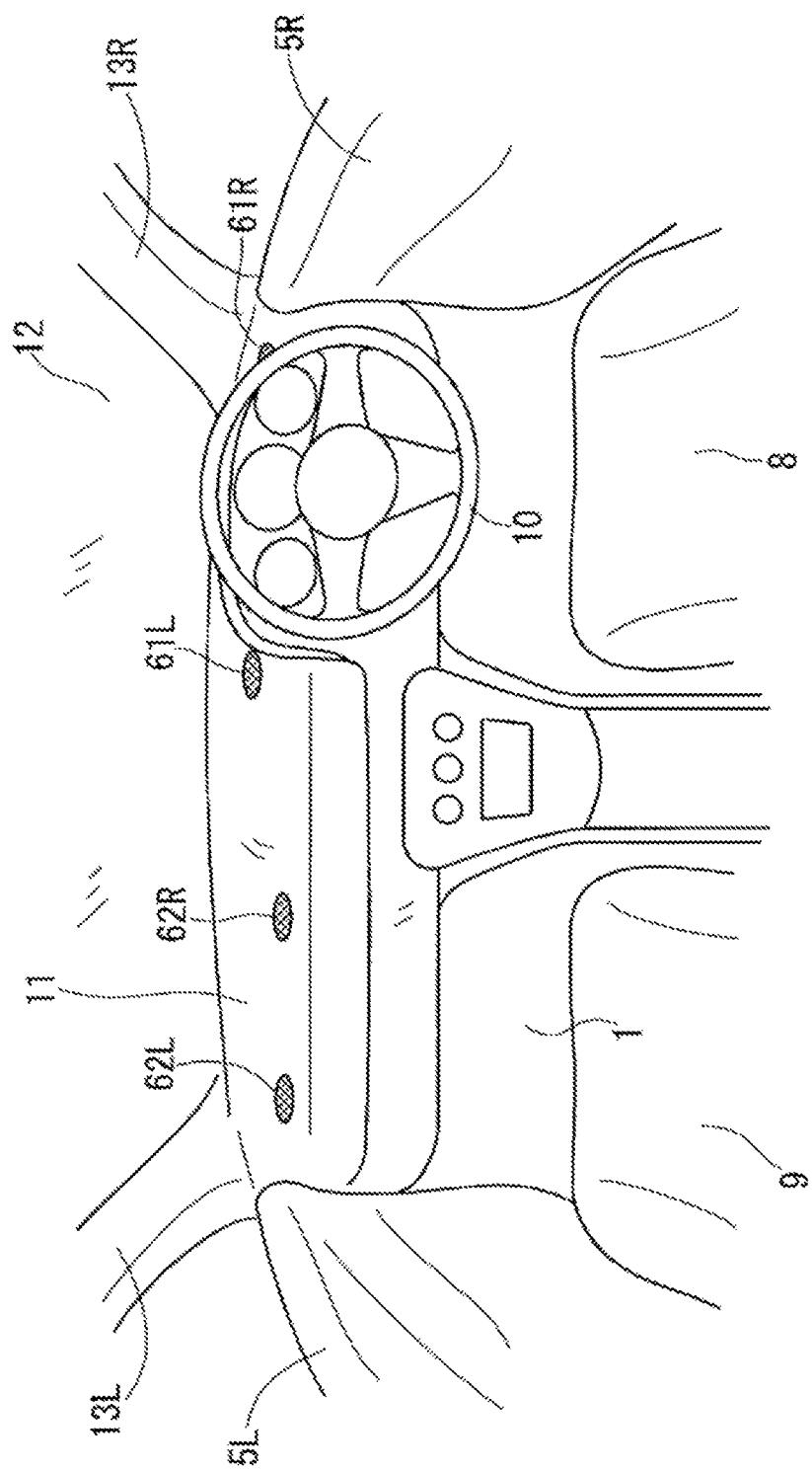
FIG. 2 is an elevational view of a cabin seen forward from a rear part thereof, illustrating a state near an instrument panel.

In FIGS. 1 and 2, a vehicle V of this embodiment is a two-door convertible. Here, the reference character "1" is a dashboard dividing an engine bay 2 from a cabin 3. The reference character "4" is a hood covering the engine bay 2 from the top thereof, the reference characters "5R" and "5L" are a pair of left and right side-doors, the reference character "6" is a trunk lid, and the reference character "7" is a retractable roof. Further, the reference character "8" is a driver seat, the reference character "9" is a front passenger's seat, and the reference character "10" is a steering wheel. Additionally, the reference character "11" is an instrument panel, the reference character "12" is a front windshield, and the reference characters "13L" and "13R" are a pair of left and right front pillars.

The engine bay 2 is provided with an engine 30. The engine 30 of this embodiment is vertically placed and drives rear wheels. The engine 30 has auxiliary equipment, such as an alternator and an air-conditioning compressor which are driven by an engine body, and an engine sound is a mixture of a sound generated when the engine body rotates or performs combustion, an intake sound, an exhaust sound, and also a sound of the auxiliary equipment being driven.

As audio sound speakers, speakers 61L and 61R for a vehicle driver (driver speakers 61L and 61R) and speakers 62L and 62R for a front passenger (front passenger speakers 62L and 62R) are provided. The driver speakers 61L and 61R are disposed with a space interval from each other in width directions of the vehicle, on the instrument panel 11 provided forward of the driver seat 8. The driver speakers 61L and 61R have strong directivities and their orientations and ranges are indicated by one-dotted chain lines in FIG. 1.

The front passenger speakers 62L and 62R are disposed with a small space interval from each other in the width directions, on the instrument panel 11 provided forward of the front passenger seat 9. The front passenger speakers 62L and 62R have weaker directivities than the driver speakers 61L and 61R, and their orientations and ranges are indicated by one-dotted chain lines in FIG. 1. Since the directivities of the front passenger speakers 62L and 62R are weak, the front passenger is able to enjoy the audio sound even when not properly seated on the front passenger seat 9.

Figure 3:
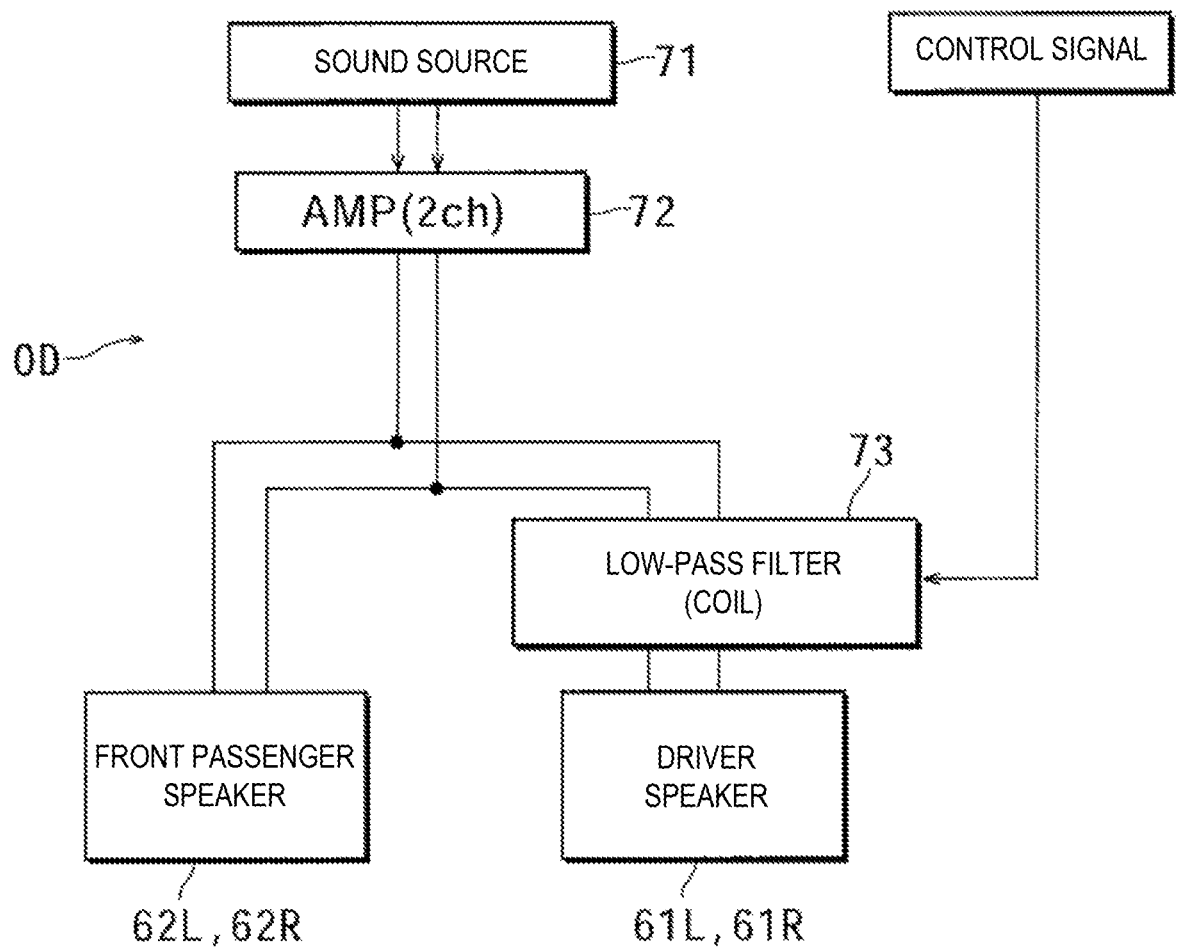
FIG. 3 is a diagram illustrating an example of a control system for degrading quality of a sound-source reproducing sound.

FIG. 3 illustrates one example of an audio device OD. In FIG. 3, reproduced signals for 2CH from an audio sound source 71 are amplified by an amplifier 72 and supplied to each of the speakers 61L, 61R, 62L, and 62R, thus the audio sound is played in the cabin 3. In this embodiment, the speakers 61L, 61R, 62L, and 62R, and the audio sound source 71 are used for high resolution and are capable of playing an extremely high-quality audio sound in the cabin 3.

The driver speakers 61L and 61R are supplied with the amplified signals by the amplifier 72, via a low-pass filter 73 which is a sound quality degrader. The low-pass filter 73 is switched on and off based on a control signal (described later) so that the quality of the audio sound from the driver speakers 61L and 61R is switchable (selectable) between a high quality (high resolution) and a low quality (e.g., equivalent to a CD level). Note that the audio sound from the front passenger speakers 62L and 62R normally has a high sound quality (high resolution).

Figure 4:
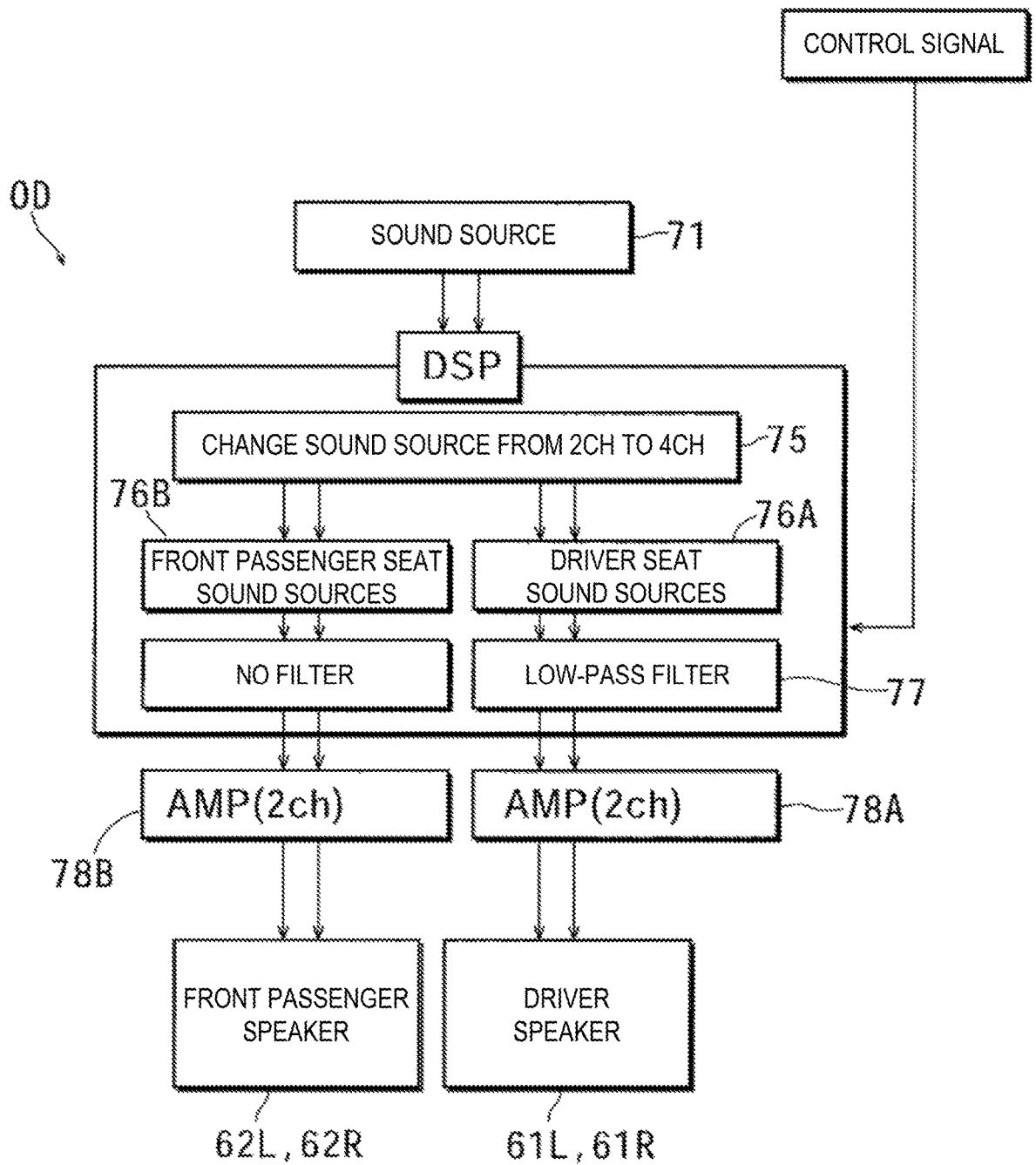
FIG. 4 is a diagram illustrating an example of another control system for degrading the quality of the sound-source reproducing sound.

FIG. 4 illustrates one modification of the audio device OD. In this example, the quality of the audio sound from the driver speakers 61L and 61R is changed by a digital sound processor (DSP) in the audio device OD. That is, the reproduced signals for 2CH (two channel) from the sound source 71 are changed to 4CH (four channel) by a CH number changer 75. A pair of 2CH signals outputted from the CH number changer 75 is supplied, as sound sources 76A for the driver seat, to the driver speakers 61L and 61R via a low-pass filter 77 and an amplifier 78A. Another pair of 2CH signals outputted from the CH number changer 75 is supplied, as sound sources 76B for the front passenger seat, to the front passenger speakers 62L and 62R via an amplifier 78B without being filtered. The low-pass filter 77 is switched on and off based on a control signal so that the quality of the audio sound from the driver speakers 61L and 61R is switchable (selectable) between a high quality (high resolution) and a low quality (equivalent to the CD level).

Figure 5:
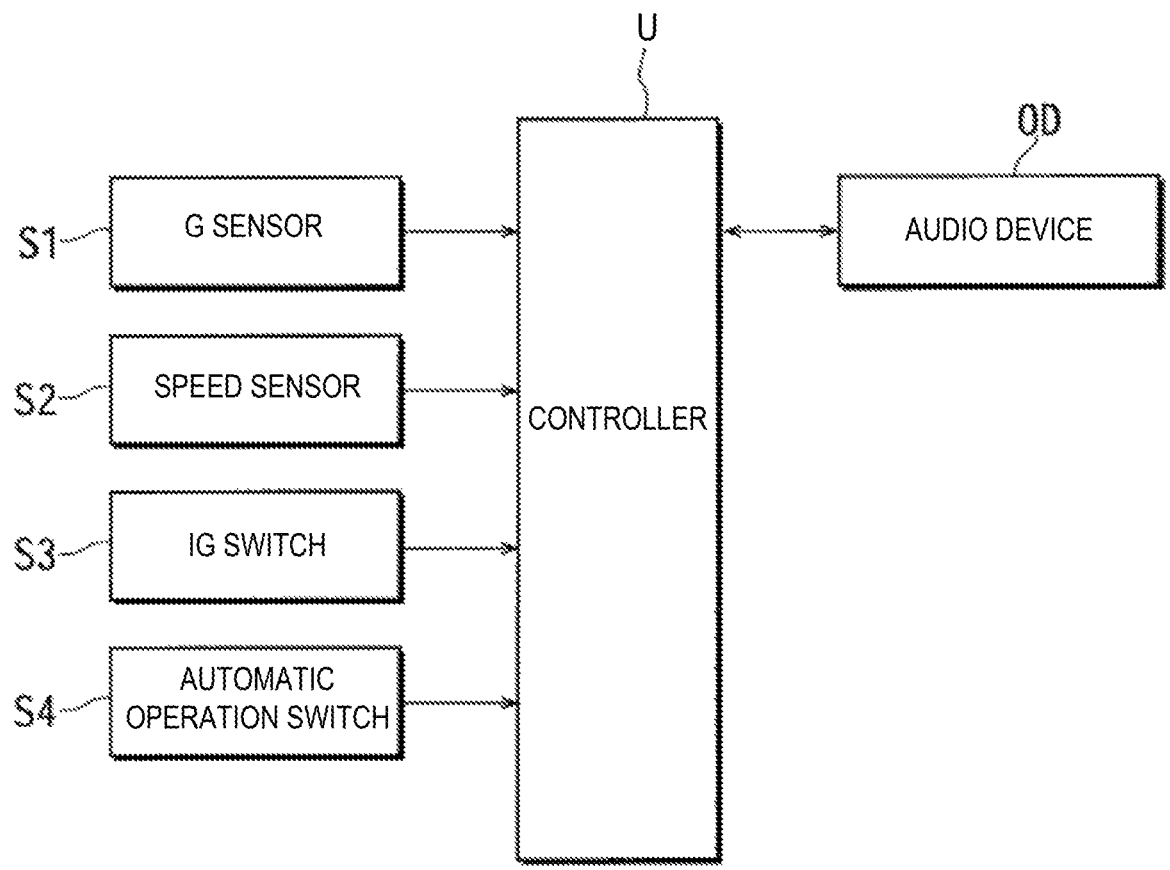
FIG. 5 is a block diagram illustrating one example of a control system for changing the sound quality of the sound-source reproducing sound.

FIG. 5 illustrates an example of a control system regarding generation of the control signals illustrated in FIGS. 3 and 4. In FIG. 5, the reference character "U" is a controller configured by using a microcomputer. This controller U receives signals from sensors or switches S1 to S4. "S1" is a G sensor (i.e., an accelerometer) which detects a G (g-force) which acts on the vehicle body (accelerations and decelerations in the longitudinal and lateral directions). "S2" is an engine speed sensor which detects the engine speed. "S3" is an ignition switch. "S4" is a switch which is manually controlled by the driver to select whether to perform an automatic operation. Any one or more of the sensors and/or switches S1 to S4 may be referred to as the traveling state determiner. Further, the controller U controls the audio device OD (outputs the control signals illustrated in FIGS. 3 and 4).

Figure 6:
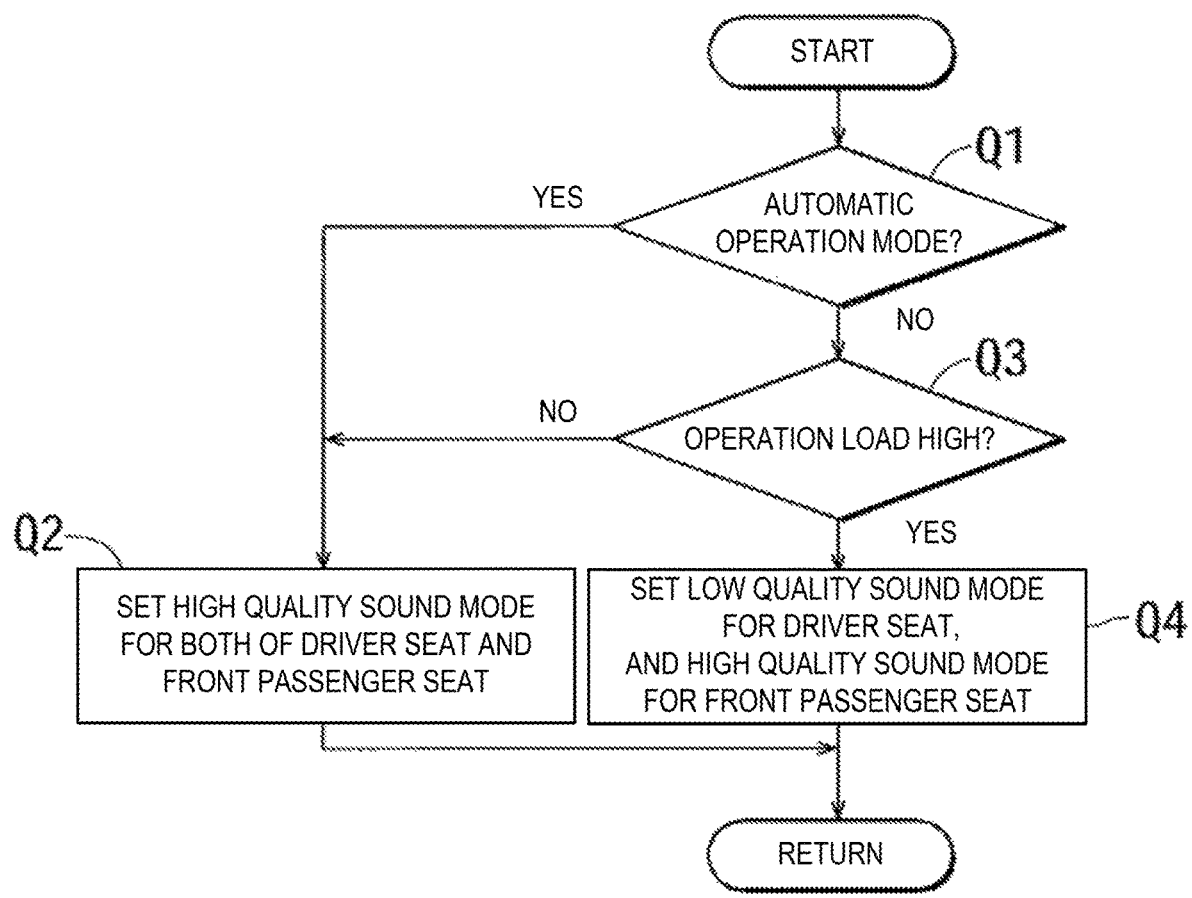
FIG. 6 is a flowchart illustrating a control example of the present disclosure.

Next, a control example of the controller U is described while referring to the flowchart of FIG. 6. Below, the reference character "Q" indicates steps. First at Q1, whether to perform the automatic operation (whether the automatic operation is selected) is determined according to a control state of the switch S4. If the result of Q1 is YES, at Q2, the driver and front passenger speakers 61L, 61R, 62L, and 62R are made to be in a state for playing the high quality (high resolution) audio sound. Thus, both the driver and front passenger are able to enjoy the high-quality audio sound. Moreover, due to a sampling frequency being high and the number of quantization bits being large for the high resolution, it is relatively easy for the driver to distinguish the engine sound and the audio sound from each other.

If the result of Q1 is NO, at Q3, whether an operation load as a given traveling state is high is determined. The state where the operation load becomes high is also considered to be a situation where driving (running) is actively performed, for example, when an engine speed is above a given speed, when the g-force which acts on a vehicle body (one or both of lateral acceleration and longitudinal acceleration) is higher than a given value, when traveling on a winding road, when acceleration/deceleration is frequently performed, when a steering operation is frequently performed, when traveling on a mountain road, when traveling on a circuit road, when a vehicle speed is high (e.g., above 80 km/h), etc.

If the result of Q3 is NO, the process proceeds to Q2. On the other hand, if the result of Q3 is YES, at Q4, the front passenger speakers 62L and 62R are made to be in a state for playing the high-quality audio sound, while the driver speakers 61L and 61R are made to be in a state for playing the low-quality audio sound. Thus, the driver is able to recognize the engine sound more clearly than the case where the audio sound is high quality, and able to enjoy driving by clearly recognizing the vehicle state based on the engine sound, which is also preferable for safe driving.

Although the embodiment is described above, the present disclosure is not limited to the embodiment, and suitable changes are possible within the range described in the claims, for example as follows.

(1) The driver speakers 61L and 61R may be disposed at suitable positions, such as a headrest of the driver seat 8. Similarly, the front passenger speakers 62L and 62R may also be disposed at suitable positions, such as a headrest of the front passenger seat 9.

(2) In the given traveling state (in this embodiment, when the operation load is high), the quality of the audio sound from the front passenger speakers 62L and 62R may also be degraded.

(3) The speakers may not be differentiated for the driver speakers and the front passenger speakers, but be shared therebetween.

(4) The adjustment of the sound quality may be performed by a suitable known method, such as adjusting the frequency resolution (changing the sampling frequency) or adjusting the amplitude resolution (changing the number of quantization bits), or cutting high frequencies over a given frequency or cutting low frequencies lower than a given frequency.

(5) A mode switch which is manually controlled by the driver may be provided so that the audio sound quality is changed according to the control of the mode switch.

(6) The change of the sound quality is preferably performed gradually (e.g., over 3 to 5 seconds) in view of preventing the person(s) on board from feeling a sense of discomfort, etc. due to the change in sound quality, and also preventing the person(s) on board from noticing the sound quality change.

(7) When changing the sound quality, the driver may be notified, but it is preferable not to notify in view of preventing irritation by the notification.

(8) By making the sound quality changeable in three levels, for example, the sound quality may be highest (e.g., high resolution) during the automatic operation or a steady travel at a low vehicle speed, lowest (e.g., equivalent to MP3 level) when the operation load is high, or otherwise medium (e.g., equivalent to the CD level).

(9) The present disclosure is not limited to be applied to the two-door convertible but is also applicable to various types of vehicles, such as a sedan type, a sport utility vehicle (SUV) type, and a four-wheel drive vehicle. The application may also be to a vehicle in which a transmission is disposed in the rear part of the vehicle (at the position of a differential), a front-wheel drive vehicle having no propeller shaft (i.e., a front-engine, front-wheel-drive (FF) vehicle), or a vehicle where the engine 30 is disposed rearward of the cabin. It is needless to say that the purpose of the present disclosure is not limited to what is explicitly described, but also implicitly includes providing what is expressed as substantially preferable or advantageous.

The present disclosure is capable of causing, even in the state where the audio sound is played in the cabin, the engine sound be recognizable more clearly as needed and extremely suitable for an audio device for a vehicle.

It should be understood that the embodiments herein are illustrative and not restrictive, since the scope of the invention is defined by the appended claims rather than by the description preceding them, and all changes that fall within metes and bounds of the claims, or equivalence of such metes and bounds thereof, are therefore intended to be embraced by the claims.

DESCRIPTION OF REFERENCE CHARACTERS

OD: Audio Device
U: Controller
S1: G Sensor (accelerometer)
S2: Engine Speed Sensor
S3: Ignition Switch
2: Engine Bay
3: Cabin
8: Driver Seat
9: Front Passenger Seat
11: Instrument Panel
12: Front Windshield
30: Engine
61L, 61R: Speaker (For Driver)
62L, 62R: Speaker (For Front Passenger)
71: Sound Source (For Audio)
73, 77: Low-pass Filter (For Low Sound Quality)

What is claimed is:

1. A sound system for a vehicle driven by an engine, comprising:
an audio device for an internal space of a cabin of the vehicle; and
a traveling state determiner configured to determine a traveling state of the vehicle,
wherein a controller of the audio device is configured to change a frequency resolution or an amplitude resolution of a sound reproduced by a sound source and, when the traveling state determined by the traveling state determiner indicates an increase in an operation load, decrease the frequency resolution or the amplitude resolution of the reproduced sound.

2. The sound system of claim 1, wherein
the vehicle is configured to selectably perform an automatic operation, and
while the automatic operation is performed, the audio device does not decrease the frequency resolution or the amplitude resolution of the reproduced sound regardless of the traveling state of the vehicle.

3. The sound system of claim 1, wherein the decrease of the frequency resolution or the amplitude resolution of the reproduced sound is performed without notification to a person in the vehicle.

4. The sound system of claim 3, wherein the decrease of the frequency resolution or the amplitude resolution of the reproduced sound is performed gradually.

5. The sound system of claim 4, wherein
speakers configured to play the reproduced sound inside the cabin are individually provided for a vehicle driver and for a front passenger, and
the decrease of the frequency resolution or the amplitude resolution of the reproduced sound is only performed for the speaker for the driver, between the speaker for the driver and the speaker for the front passenger.

6. The sound system of claim 3, wherein
speakers configured to play the reproduced sound inside the cabin are individually provided for a vehicle driver and for a front passenger, and
the decrease of the frequency resolution or the amplitude resolution of the reproduced sound is only performed for the speaker for the driver, between the speaker for the driver and the speaker for the front passenger.

7. The sound system of claim 1, wherein the decrease of the frequency resolution or the amplitude resolution of the reproduced sound is performed gradually.

8. The sound system of claim 7, wherein
speakers configured to play the reproduced sound inside the cabin are individually provided for a vehicle driver and a front passenger, and
the decrease of the frequency resolution or the amplitude resolution of the reproduced sound is only performed for the speaker for the driver, between the speaker for the driver and the speaker for the front passenger.

9. The sound system of claim 1, wherein
speakers configured to play the reproduced sound inside the cabin are individually provided for a vehicle driver and a front passenger, and
the decrease of the frequency resolution or the amplitude resolution of the reproduced sound is only performed for the speaker for the driver, between the speaker for the driver and the speaker for the front passenger.

10. The sound system of claim 1, wherein the traveling state determiner is a one or more of an accelerometer, an engine speed sensor, a manual switch, and an ignition switch.

11. The sound system of claim 1, wherein the increase in the operation load is an increase in one or more of an engine speed, a vehicle speed, a vehicle acceleration, an acceleration frequency, or a steering operation frequency.

12. The sound system of claim 3, wherein the increase in the operation load is an increase in one or more of an engine speed, a vehicle speed, a vehicle acceleration, an acceleration frequency, or a steering operation frequency.

13. The sound system of claim 4, wherein the increase in the operation load is an increase in one or more of an engine speed, a vehicle speed, a vehicle acceleration, an acceleration frequency, or a steering operation frequency.

14. The sound system of claim 5, wherein the increase in the operation load is an increase in one or more of an engine speed, a vehicle speed, a vehicle acceleration, an acceleration frequency, or a steering operation frequency.

15. The sound system of claim 6, wherein the increase in the operation load is an increase in one or more of an engine speed, a vehicle speed, a vehicle acceleration, an acceleration frequency, or a steering operation frequency.

16. The sound system of claim 7, wherein the increase in the operation load is an increase in one or more of an engine speed, a vehicle speed, a vehicle acceleration, an acceleration frequency, or a steering operation frequency.

17. The sound system of claim 8, wherein the increase in the operation load is an increase in one or more of an engine speed, a vehicle speed, a vehicle acceleration, an acceleration frequency, or a steering operation frequency.

18. The sound system of claim 9, wherein the increase in the operation load is an increase in one or more of an engine speed, a vehicle speed, a vehicle acceleration, an acceleration frequency, or a steering operation frequency.

* * * * *